United States Patent
Jeon

(10) Patent No.: US 7,951,261 B2
(45) Date of Patent: May 31, 2011

(54) PLASMA ETCHING APPARATUS

(75) Inventor: Bu-Il Jeon, Gyeonggi-do (KR)

(73) Assignee: Jusung Engineering Co. Ltd., Gwangju-Si (KR)

( * ) Notice: Subject to any disclaimer, the term of this patent is extended or adjusted under 35 U.S.C. 154(b) by 652 days.

(21) Appl. No.: 11/462,313

(22) Filed: Aug. 3, 2006

(65) Prior Publication Data
US 2008/0173401 A1    Jul. 24, 2008

(30) Foreign Application Priority Data
Aug. 4, 2005   (KR) .................. 10-2005-0071385

(51) Int. Cl.
*C23C 16/00* (2006.01)
*C23F 1/00* (2006.01)
*H01L 21/306* (2006.01)

(52) U.S. Cl. ............... 156/345.43; 118/715; 118/723 E; 118/723 R; 156/345.3; 156/345.44; 156/345.45; 156/345.46; 156/345.47

(58) Field of Classification Search .................. 118/720, 118/729, 730; 156/345.14, 345.51, 345.52, 156/345.53, 345.54, 345.55
See application file for complete search history.

(56) References Cited

U.S. PATENT DOCUMENTS

| | | | |
|---|---|---|---|
| 4,209,357 A * | 6/1980 | Gorin et al. ................... | 438/710 |
| 5,290,993 A | 3/1994 | Kaji et al. | |
| 5,314,570 A * | 5/1994 | Ikegaya et al. ................ | 117/103 |
| 5,556,500 A | 9/1996 | Hasegawa et al. | |
| 5,945,351 A | 8/1999 | Mathuni | |
| 6,004,631 A | 12/1999 | Mori | |
| 6,074,518 A * | 6/2000 | Imafuku et al. .......... | 156/345.46 |
| 6,232,236 B1 | 5/2001 | Shan et al. | |
| 6,475,336 B1 * | 11/2002 | Hubacek ................... | 156/345.51 |
| 2003/0029567 A1 * | 2/2003 | Dhindsa et al. .......... | 156/345.47 |
| 2003/0203650 A1 | 10/2003 | Robbins | |
| 2004/0238488 A1 * | 12/2004 | Choi et al. ....................... | 216/58 |
| 2005/0006028 A1 * | 1/2005 | Keil et al. ................ | 156/345.46 |
| 2005/0039682 A1 * | 2/2005 | Dhindsa et al. ........... | 118/723 E |
| 2005/0164513 A1 | 7/2005 | DeOrnellas et al. | |
| 2005/0173067 A1 * | 8/2005 | Lim .......................... | 156/345.32 |
| 2005/0178505 A1 * | 8/2005 | Kim ......................... | 156/345.47 |

FOREIGN PATENT DOCUMENTS

| | | |
|---|---|---|
| DE | 102004024893 A1 | 4/2005 |
| EP | 0525633 | 2/1993 |
| EP | 0663382 A1 | 7/1995 |
| EP | 1560262 A1 | 8/2005 |
| KR | 2002-0080955 | 10/2002 |
| KR | WO/03075333 | * 12/2003 |
| WO | 99/33087 | 7/1999 |
| WO | WO/2004/100247 | * 11/2004 |

* cited by examiner

*Primary Examiner* — Parviz Hassanzadeh
*Assistant Examiner* — Tiffany Nuckols
(74) *Attorney, Agent, or Firm* — Portland IP Law LLC

(57) ABSTRACT

The present invention relates to a plasma etching apparatus. In the apparatus, potential difference is applied between a substrate support with a substrate seated thereon and a electrode surrounding an edge region of the substrate, and a distance between the substrate and the electrode is set to 3 mm or less so as to locally generate plasma in an area between the substrate and the electrode, thereby removing particles and a thin film in the edge region of the substrate.

19 Claims, 6 Drawing Sheets

Prior Art

PLASMA ETCHING APPARATUS

CROSS-REFERENCE TO RELATED APPLICATIONS

This U.S. non-provisional patent application claims priority under 35 U.S.C. §119 of Korean Patent Applications 2005-0071385 filed on Aug. 4, 2005, the entire contents of which are hereby incorporated by reference.

BACKGROUND OF THE INVENTION

1. Field of the Invention

The present invention relates to a plasma etching apparatus, and more particularly, to a plasma etching apparatus that employs dielectric barrier discharge (DBD) or high pressure capacitively coupled plasma (CCP) discharge to remove a film material in an edge region of a substrate.

2. Description of the Related Art

A method of fabricating semiconductor devices or liquid crystal display devices comprises a process of depositing a plurality of thin films and a process of patterning the films by means of etching.

In general, the deposition and etching of the film are performed in a chamber. In a state where a substrate is seated on the top of a substrate support in the chamber, a reaction gas, a source gas and the like are supplied into the chamber so that a thin film can be deposited on the substrate. At this time, as shown in FIG. 1, the thin film partially remains on upper, side and lower portions of edge regions (see, regions designated by "A" in FIG. 1) of the substrate 10. Accordingly, the portions of the thin film formed on the edge regions of the substrate should be removed.

However, a conventional method of etching a substrate is carried out by using a variety of chemicals. The chemicals involve disadvantages of an adverse effect on the environment and difficulty in local cleaning thereof. Accordingly, new etching methods have been actively studied and applied in practice. One of new etching methods is to use plasma.

Here, plasma refers to ionized gas that is composed of ions, electrons, radicals and the like. This plasma is generated at an ultra-high temperature, a strong electric field, or a high-frequency electromagnetic field.

In particular, the generation of plasma through a glow discharge is achieved by free electrons excited under a direct current or a high-frequency electromagnetic field. The excited free electrons collide with gas molecules to produce an active group such as ions, radicals and electrons. This active group physically and chemically affects the surface of a material, thereby changing the characteristics of the surface. Methods for etching a substrate using plasma can be classified according to pressure in an area where a plasma state is established in a chamber.

In the related art, a glow discharge plasma is generated at low pressure that approximates vacuum. A conventional low-pressure plasma etching apparatus is disclosed in Korean Patent Laid-Open Publication No. 2002-80955. In the conventional low-pressure plasma etching apparatus, an insulator is disposed on the top of a substrate support to face a wafer that will be seated thereon, and an electrode for generating plasma is disposed at an outer periphery of the substrate support and insulator to generate plasma only at an edge region of the wafer, thereby cleaning the edge region of the wafer. In order to generate plasma at low pressure in the conventional plasma etching apparatus, the process should be performed in a low-pressure state, i.e., airtight vacuum state. Accordingly, expensive equipment such as a vacuum chamber, a vacuum exhaust system and the like is required, and the complicated inner configuration of the apparatus causes a problem in that a great deal of time is required for maintenance of the apparatus and vacuum pumping. Furthermore, there is a problem in that it is difficult to apply the apparatus to consecutive processes performed at approximately atmospheric pressure.

SUMMARY OF THE INVENTION

Accordingly, the present invention is conceived to solve the aforementioned problems. An object of the present invention is to provide a plasma etching apparatus employing DBD or high-pressure CCP discharge, which can remove a film material in an edge region of a substrate by generating plasma at approximately atmospheric pressure.

According to the present invention, there is provided a plasma etching apparatus, comprising a chamber; a substrate support disposed in the chamber so that a substrate can be placed thereon; an electrode provided to correspond to an edge region of the substrate and to have a gap between the electrode and the edge region of the substrate is smaller than a gap between an upper wall of the chamber and the substrate; and a power supply means for supplying power to the substrate support.

Here, the edge region of the substrate is preferably in a range of 0.5 to 4 mm.

The distance between the substrate and the upper wall of the chamber is preferably 30 to 50 mm.

It is preferred that the electrode comprise a first electrode located at an edge region of an upper side of the substrate and a second electrode located at an edge region of a lower side of the substrate.

At this time, the gap between the electrode and the substrate is preferably 0.1 to 5 mm or 1 to 1.5 mm.

Preferably, the electrode has a dielectric film formed on a surface thereof.

A gap between the dielectric film and the substrate is preferably 0.1 to 5 mm.

It is preferred that the plasma etching apparatus further comprise a non-reactive gas injection nozzle for injecting a non-reactive gas installed at a portion of the upper wall of the chamber corresponding to the substrate. Preferably, the plasma etching apparatus further comprises a reaction gas injection nozzle for injecting a reaction gas installed at the electrode.

Here, it is preferred that the plasma etching apparatus further comprise a substrate support-driving unit installed below the substrate support so that the substrate support can be lifted and lowered to allow the substrate to be introduced into and withdrawn from the chamber.

Pressure in the chamber is preferably maintained in a range of 10 to 1,000 Torr or 700 to 800 Torr.

The plasma etching apparatus may further comprise a magnetic field creating means installed below the electrode. Moreover, the electrode may have a barrier formed on a side surface thereof. At this time, it is preferred that the barrier extend from the side surface of the electrode toward the substrate, and a gap between the barrier and the substrate be 0.1 to 5 mm.

BRIEF DESCRIPTION OF THE DRAWINGS

The above and other objects, features and advantages of the present invention will become apparent from the following description of preferred embodiments given in conjunction with the accompanying drawings, in which.

DESCRIPTION OF THE PREFERRED EMBODIMENTS

Figure 1:
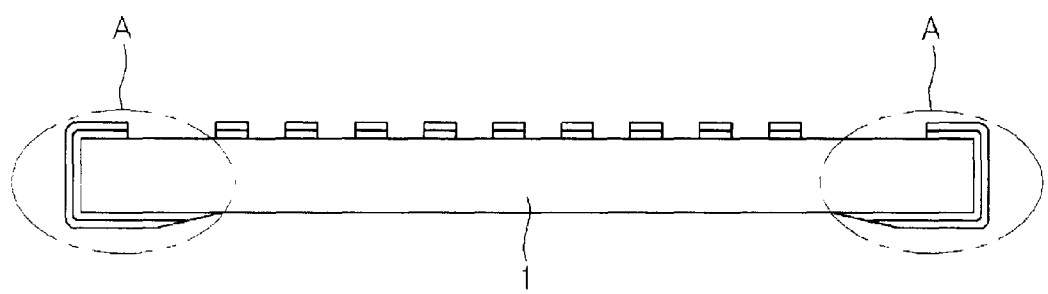
FIG. 1 is a conceptual sectional view of a substrate, illustrating a problem of a conventional substrate.

Hereinafter, preferred embodiments of the present invention will be described in detail with reference to the accompanying drawings. However, the present invention is not limited to the embodiments but may be implemented into different forms. These embodiments are provided only for illustrative purposes and for full understanding of the scope of the present invention by those skilled in the art. Throughout the drawings, like elements are designated by like reference numerals.

Figure 2:
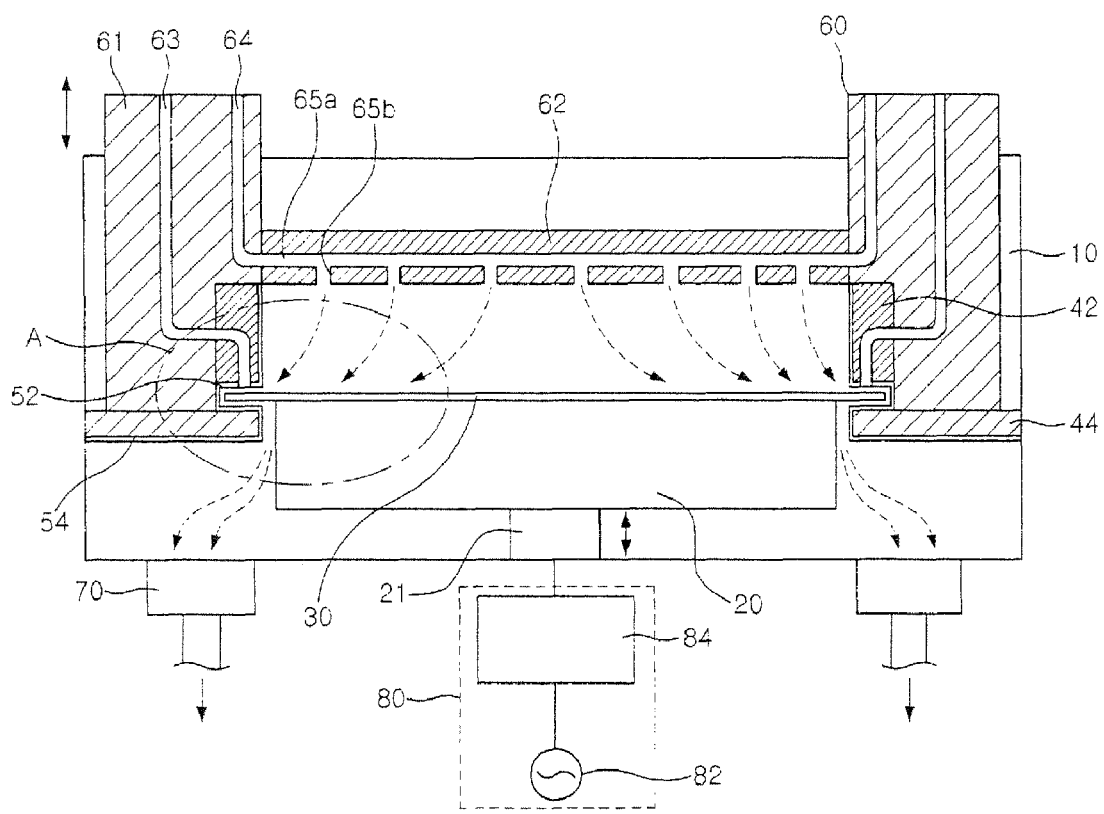
FIG. 2 is a conceptual sectional view of a plasma etching apparatus according to an embodiment of the present invention.
Figure 3:
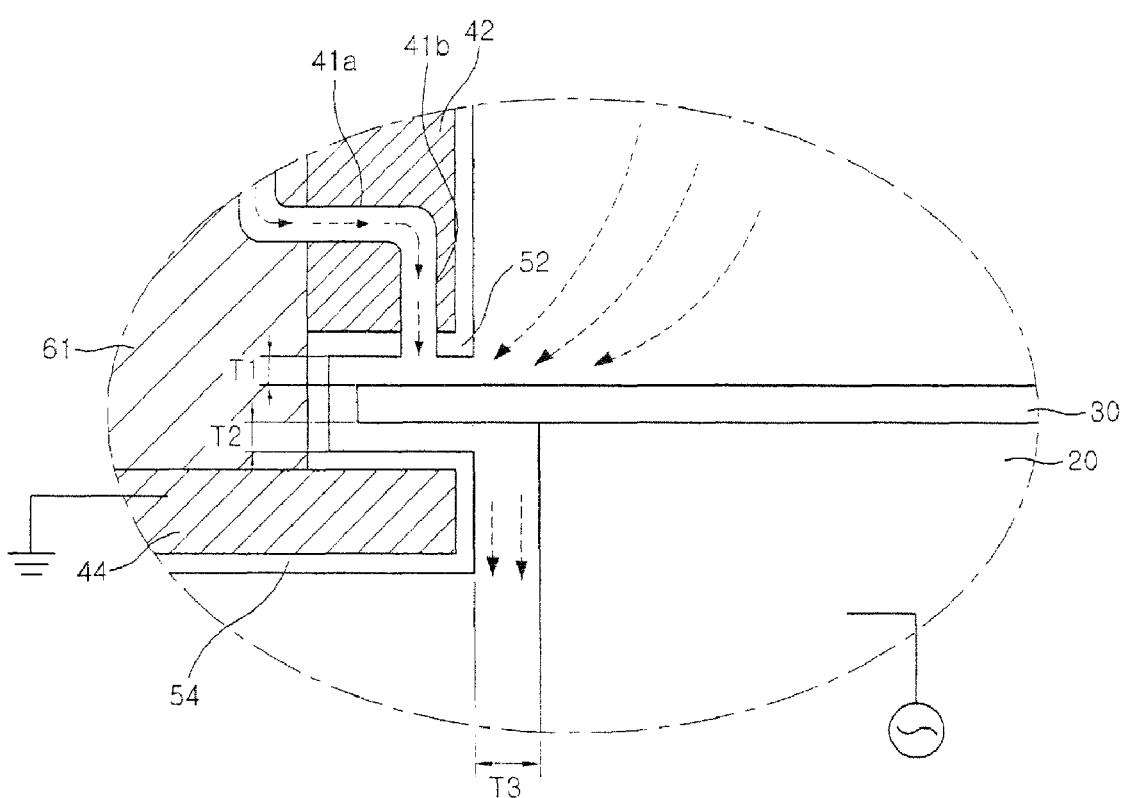
FIG. 3 is an enlarged sectional view of an area designated by "A" in FIG. 2.
Figure 4:
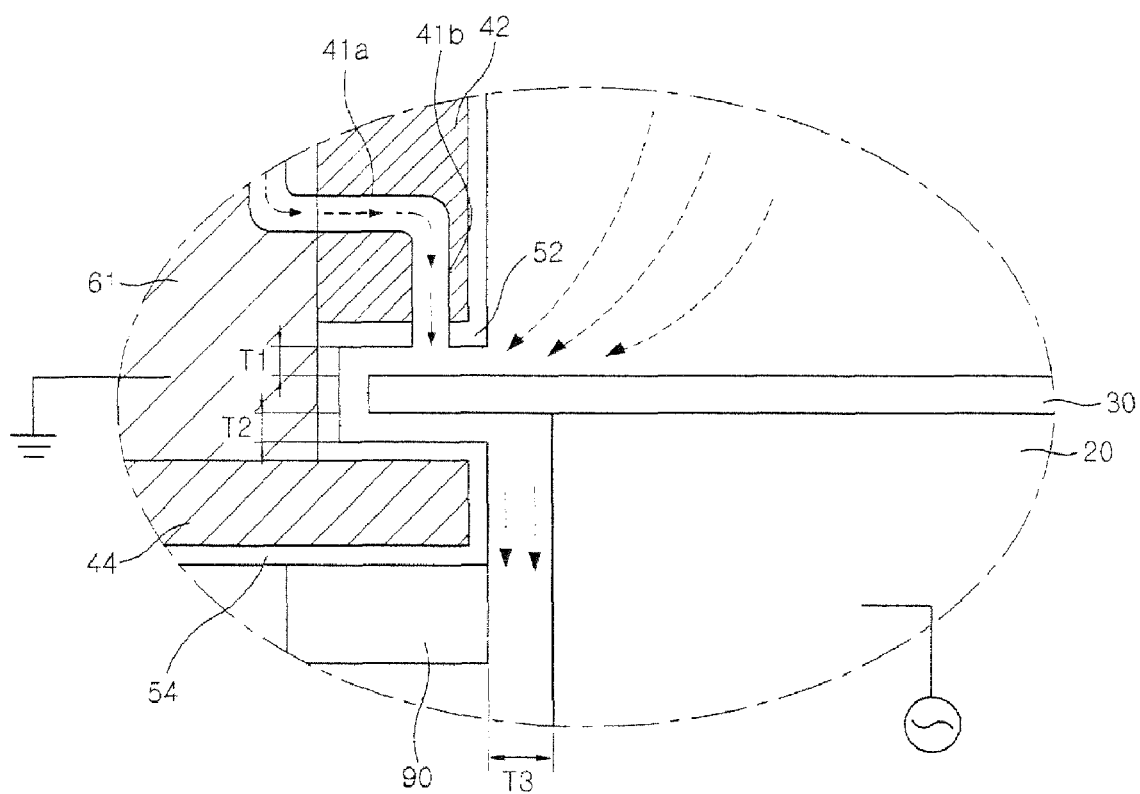
FIG. 4 is an enlarged sectional view of an area designated by "A" in FIG. 2 in a variant of the plasma etching apparatus according to the embodiment of the present invention.

FIG. 2 is a conceptual sectional view of a plasma etching apparatus according to an embodiment of the present invention, FIG. 3 is an enlarged sectional view of an area designated by "A" in FIG. 2, and FIG. 4 is an enlarged sectional view of an area designated by "A" in FIG. 2 in a variant of the plasma etching apparatus according to the embodiment of the present invention.

Referring to FIGS. 2 and 3, a plasma etching apparatus according to an embodiment of the present invention comprises a chamber 10, a substrate support 20 on which a substrate 30 is to be placed, electrodes 42 and 44 disposed close to an edge region of the substrate 30, dielectric films 52 and 54 formed on at least portions of the surfaces of the electrodes 42 and 44, and a power supply means 80 for generating potential difference between the electrodes 42 and 44 and the substrate support 20.

Further, in this embodiment, an additional entrance/exit (not shown) through which the substrate 30 can be introduced or withdrawn is formed at a side of the chamber 10. A substrate support-driving unit 21 is further installed below the substrate support 20 to allow the substrate support 20 to be lifted and lowered so that the substrate 30 can be easily introduced and withdrawn. The substrate 30 is loaded through the entrance/exit, and the substrate support 20 is lifted by the substrate support-driving unit 21 so that the loaded substrate 30 can be placed on the substrate support 20.

The plasma etching apparatus further comprises an exhaust unit 70 for exhausting gases and reaction by-products such as particles that may be produced during an etching process. In this embodiment, it is preferred that the exhaust units 70 be formed at both sides on the bottom of the substrate support 20 as shown in the figures. The power supply means 80 further comprises an RF power generating unit 82 and an impedance matching means 84 connected between the RF power generating unit 82 and the substrate support 20 so as to match power therebetween. Accordingly, RF power is generated in the RF power generating unit 82 and then applied to the substrate support 20 through the impedance matching means 84.

It is preferred that the electrodes 42 and 44 be disposed to correspond to the edge region of the substrate 30, and a gap between each of the electrodes 42 and 44 and the edge region of the substrate 30 be shorter than a distance between an upper wall of the chamber 10 and the substrate 30. The electrodes 42 and 44 may be formed integrally with each other, or separately from each other to allow the substrate 30 to be easily loaded and unloaded.

In the plasma etching apparatus of this embodiment, two electrodes are formed separately and connected to each other so as to surround the edge area of the substrate. That is, in order to etch particles and a thin film in an edge area of an upper surface, a side surface area and an edge area of a lower surface of the substrate 30 by using plasma, the first electrode 42 is disposed above the edge area of the upper surface of the substrate 30 and the second electrode 44 is disposed below the edge area of the lower surface of the substrate 30. Plasma is generated in an area where the substrate 30 overlaps with the first and second electrodes 42 and 44. Here, it is preferred that dielectric films 52 and 54 be formed on the surfaces of the first and second electrodes 42 and 44.

The first electrode 42 is formed in the same shape as the first electrode 42. In this embodiment, however, it is preferred that the first electrode be made in the form of an annular strip with a central opening. Preferably, the width of an overlapping area of the first electrode 42 and the substrate 30 (at the edge region of the substrate) is identical with that of an area on the upper surface of the substrate 30 where a device-forming pattern is not formed. Moreover, it is preferred that the width of the overlapping area is identical with that of an area where an alignment key is formed. At this time, the edge region of the substrate 30 corresponds to an area in a range of 0.5 to 4 mm inward from an outermost end of the substrate.

Here, a gas passageway 41a and a gas injection nozzle 41b are formed in the first electrode 42. A reaction gas supplied from the outside can be injected therethrough to an area between the substrate 30 to be etched and the electrodes 42 and 44. At this time, Ar, CF4 and the like can be used as the reaction gas. A distance between the first electrode 42 and the substrate 30 (see, T1 in FIG. 3) is preferably 0.1 to 5 mm, and more preferably 1 to 1.5 mm at the edge area of the substrate 30, i.e., at the overlapping area. Since a process is performed at approximately atmospheric pressure in the plasma etching apparatus of the present invention, plasma is not generated if the distance between the substrate 30 and the first electrode 42 with the potential difference is out of the aforementioned range.

It is preferred that the second electrode 44 be made in the form of a plate extending from an inner surface of the chamber 10 and having a central opening. The substrate support 20 on which the substrate 30 is seated is located in the center opening of the second electrode 44. It is preferred that the second electrode 44 be spaced apart from the substrate support 20 as shown in the figures. The process by-products and the gases can flow out through the exhaust unit 70 via such spacing. Preferably, the spacing between the second electrode 44 and the substrate support 20 (see, T3 in FIG. 3) is 0.1 mm to 100 mm. The dielectric films 52 and 54 are formed on an area where the second electrode 44 overlaps with the substrate 30. The second electrode 44 preferably has a length corresponding to the first electrode 42. With such a structure, a thin film or particles formed at a lower side of the substrate 30 can be effectively removed. More preferably, a distance between the second electrode 44 and the substrate 30 (see, T2 in FIG. 3) in the overlapping area is 0.1 to 5 mm, and more preferably 1 to 1.5 mm.

The first and second electrodes 42 and 44 can be physically or electrically connected to each other through a conductive frame 60. In this embodiment, it is preferred that the first electrode 42 be coupled to the conductive frame 60 that moves in an up and down direction. When the substrate 30 is loaded into the chamber 10, the conductive frame 60 is lifted and the substrate 30 is then seated on the substrate support 20. Thereafter, the conductive frame 60 is lowered and connected to the second electrode 44, so that the first and second electrodes 42 and 44 can have the same potential level.

It will be apparent that the structure of the first and second electrodes and the conductive frame is not limited thereto. Alternatively, the second electrode 44 and the conductive frame 60 may be manufactured integrally with each other, and the first electrode 42 may be then coupled to the conductive frame 60, so that they can have the same potential level. At this time, the first electrode 42 may be fixed and the second electrode 44 and the conductive frame 60, which are formed integrally with each other, may be moved in an up and down direction, so that the substrate 30 can be easily loaded. Otherwise, the second electrode 44 and the conductive frame 60, which are formed integrally with each other, may be fixed and the first electrode 42 may be moved in an upward and downward direction, so that the substrate 30 can be easily loaded. The first electrode 42, the second electrode 44 and the conductive frame 60 may be formed integrally with one another through a material with electrical conductivity, so that they can have the same potential level. Further, the first electrode 42, the second electrode 44 and the conductive frame 60 may be connected to the chamber 10, so that the first and second electrodes 42 and 44 and the conductive frame 60 may have the same potential through the chamber 10. The first and second electrodes 42 and 44 and the conductive frame 60 may have the same potential through a variety of methods in addition to the methods described above.

As shown in FIG. 2, the first and second electrodes 42 and 44 are also connected to a lower end of an inner surface of a sidewall 61 of the chamber. An upper wall 62 of the chamber is formed at an upper region of the sidewall 61 to be spaced apart from the substrate 30 by a certain distance or more. That is, the upper wall should be spaced apart from the substrate by at least a distance enough to avoid generation of plasma through the sidewall 61 and the substrate support 20. The sidewall 61 may take the shape of a hollow cylinder, and the upper wall 62 with a circular plate shape may be disposed at an upper side of the cylinder. It will be apparent that the sidewall 61 may be constructed of a plurality of cylinders or polygonal posts, and the plurality of cylinders or polygonal posts may be coupled to one another by the upper wall 62 with a circular or polygonal plate shape.

If the sidewall 61 is in the form of a hollow cylinder with a certain thickness as described above, a plurality of gas tubes 63 and 64 are formed in the sidewall 61, and a curtain gas passageway 65a and curtain gas injection nozzles 65b are formed in the upper wall 62. The first gas tube 63 formed in the sidewall 61 is connected to the gas passageway 41a of the first electrode 42 to supply a reaction gas, and the second gas tube 64 formed in the sidewall 61 communicates with the curtain gas passageway 65a formed in the upper wall 62 so that a non-reactive gas can be injected through the curtain gas injection nozzles 65b to the substrate 30 which is disposed at a certain distance below the upper wall 62. Such a non-reaction gas functions as a gas curtain for protecting an area of the substrate, which is not intended to be etched. The present invention is not limited thereto. The gas may be injected to a side surface of the sidewall 61, i.e., an area from which the first electrode 42 is spaced, or to an area of the second electrode 44.

Accordingly, a "⊏-shaped" plasma generating space is defined by the first electrode 42 and the second electrode 44, as shown in FIG. 3.

At this time, in this embodiment, ground potential is applied to the first and second electrodes 42 and 44 and RF power is applied to the substrate 20 to generate plasma in the plasma generating space. That is, when the surfaces of the grounded electrodes 42 and 44 are covered with insulators and RF power is applied to the substrate 30 through the substrate support 20 in the DBD manner, plasma is generated in only an area between the substrate 30 and the grounded electrodes 42 and 44. At this time, the plasma generating process is performed within the chamber 10 at a pressure of 10 to 1,000 Torr and a temperature of 15 to 40° C. Preferably, the plasma generating process is performed at a pressure of 700 to 800 Torr. In the present invention described above, the plasma generating process can be performed at normal temperature and at approximately atmospheric pressure, and an arc is not generated due to the dielectric films 52 and 54 formed on the surfaces of the electrodes 42 and 44. Further, plasma is not generated above a central area of the substrate 30, i.e., in a space between the center of the substrate 30 with patterns formed thereon and the upper wall 62 spaced from the substrate. In order to generate plasma using DBD at approximately atmospheric pressure, a distance between two members with potential difference should be in a certain range. Accordingly, since a certain space is formed above the central area of the substrate 30, plasma is not generated in this space.

To prevent plasma, which has been generated in the plasma generating space, from being introduced into the central area of the substrate 30 in the present invention, the non-reactive gas is injected to an upper side of the substrate 30 through the curtain gas injection nozzles 65b formed in the upper wall above the central area of the substrate 30. With this process, pressure in an area above the substrate 30 is higher than that in the plasma generating space, thereby preventing by-products generated in the plasma generating space from being introduced into the central area of the substrate 30 with patterns formed thereon. Moreover, the exhaust unit 70 installed below the second electrode 42 causes pressure in an area below the substrate 30 to be lower than that in the plasma generating space, thereby exhausting the by-products generated in the plasma generating space to the area below the substrate 30. That is, a gas flow indicated by dotted lines in FIG. 2 is generated to prevent the by-products from being introduced into the central area of the substrate 30 with the patterns formed thereon.

The plasma etching apparatus of the present invention may further comprise a magnetic field creating means 90 for additionally creating a magnetic field so as to improve an etch rate of plasma. That is, as shown in FIG. 4, an electromagnet or a permanent magnet as the magnetic field creating means 90 is disposed below the second electrode 44 to apply the magnetic field to the plasma generating space. Accordingly, active electrons of plasma are moved along the magnetic field created by the magnetic field creating means 90. Here, the magnetic field creating means 90 is formed in at least a portion of an area below the second electrode 44. Preferably, the magnetic field creating means is constructed in the form of a circular strip along the second electrode 44. It will be apparent that the magnetic field creating means is not limited thereto. The magnetic field creating means may be formed at the first electrode 42 or the conductive frame 60.

Although the discharge at atmospheric pressure using DBD has been described in the above, the present invention is not limited thereto. For example, high-pressure CCP discharge may be used.

In addition, in the plasma etching apparatus of the present invention, it is possible to prevent electron discharge between a side surface of the electrode and the substrate by forming a barrier on the side surface of the electrode.

Hereinafter, the plasma etching apparatus according to another embodiment of the present invention will be described in detail with reference to the accompanying drawings. In the following description, a description overlapping with that of the previous embodiment will be omitted.

Figure 5:
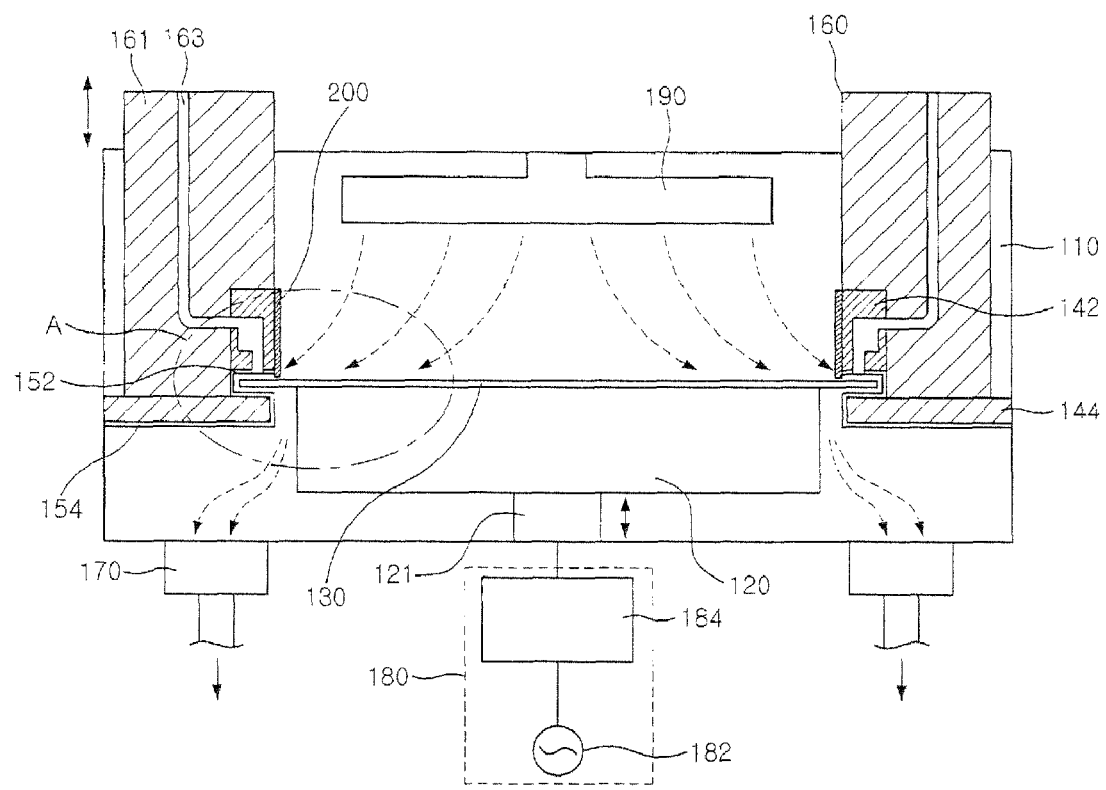
FIG. 5 is a conceptual sectional view of a plasma etching apparatus according to another embodiment of the present invention.
Figure 6:
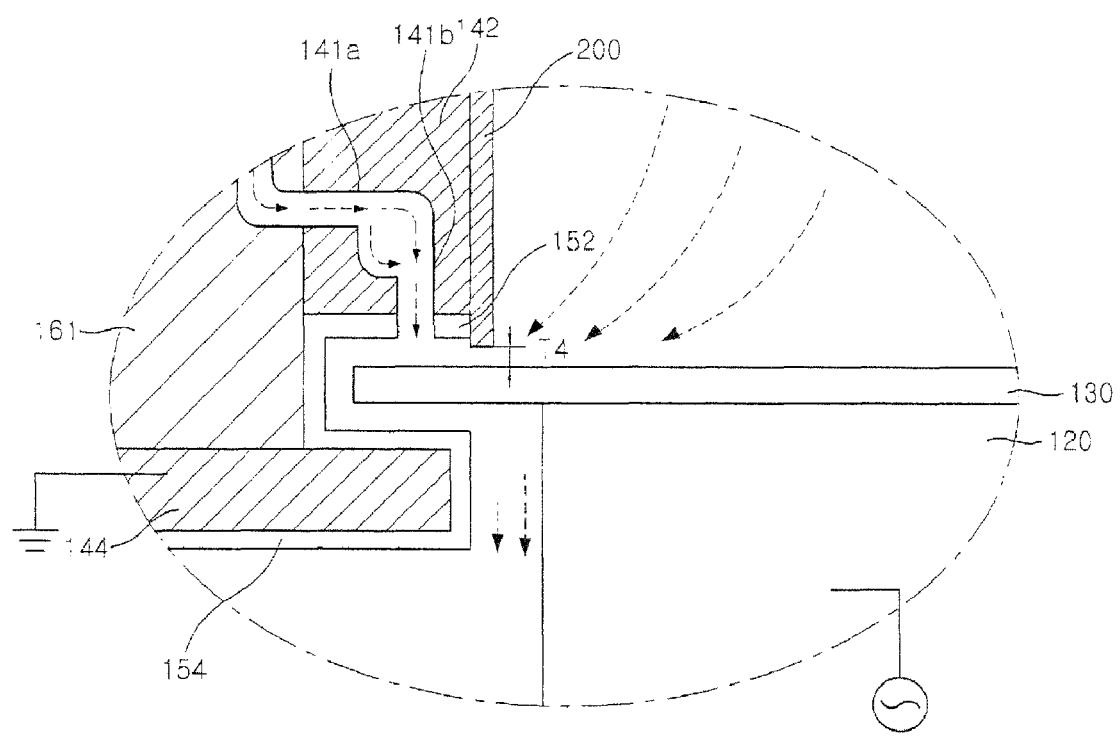
FIG. 6 is an enlarged sectional view of an area designated by "A" in FIG. 5.

FIG. 5 is a conceptual sectional view of a plasma etching apparatus according to another embodiment of the present invention, and FIG. 6 is an enlarged sectional view of an area designated by "A" in FIG. 5.

Referring to FIGS. 5 and 6, the plasma etching apparatus of this embodiment comprises a chamber 110 with a space in which etching is performed; a substrate support 120 on which a substrate 130 to be etched is seated; electrodes 142 and 144 disposed close to an edge region of the substrate 130; a curtain gas injecting means 190 spaced from a central area of an upper side of the substrate 130 to inject a curtain gas to the upper side of the substrate 130; a power supply means 180 for generating potential difference between the electrodes 142 and 144 and the substrate support 120; and a barrier 200 formed on side surfaces of the electrodes 142 and 144.

Dielectric films 152 and 154 are formed on surfaces of the electrodes 142 and 144 facing the substrate 130, and a gas supplying passageway 141a and an injection nozzle 141b are formed in the electrode 142 to inject a gas into an area adjacent to the substrate 130.

As for the electrodes in this embodiment, the first electrode 142 is adjacent to an edge region of the upper side of the substrate 130 and the second electrode 144 is adjacent to a lower side of the substrate 130. Here, the first electrode 142 can be connected to a conductive frame 160. With a vertical movement of the conductive frame 160, a distance between the first electrode 142 and the substrate 130 can be adjusted and it is possible to prevent the substrate 130 from colliding with the first electrode 142 when the substrate 130 is loaded and unloaded. Meanwhile, the substrate support 120 can also be moved in an up and down direction, so that the distance between the first electrode 142 and the substrate 130 as well as a distance between the second electrode 144 and the substrate 130 can be adjusted. Here, the distance is preferably 0.1 to 5 mm. Accordingly, potential applied to the substrate support 120 is transmitted to the substrate 130. Due to potential difference between the substrate 130 and the electrodes 142 and 144 disposed close to the edge region of the substrate, plasma is generated in an area therebetween, i.e., plasma generating area. At this time, in this embodiment, the electrodes 142 and 144 are grounded and RF power is applied to the substrate support 120, as shown in FIG. 6. The plasma generating process is performed in the chamber 100 at a pressure of 700 to 800 Torr, which approximates atmospheric pressure, and a temperature of 15 to 40° C.

In the above, if plasma generated in the plasma generating area at the edge region of the substrate 130 is diffused to a central area of the chamber 100, thin film patterns formed on the substrate are damaged by such plasma. To prevent this damage, in this embodiment, the curtain gas injecting means 190 is provided at the central area of the upper side of the substrate 130, i.e., an upper area of the chamber 100, to inject a curtain gas, and an exhaust unit 170 is provided at a lower area of the chamber 100 to exhaust a gas existing in the chamber 100 to the outside. With this structure, the curtain gas injected to the upper side of the substrate 130 is exhausted to the outside of the chamber 100 through the edge region of the upper side of the substrate 130 and through an area below the substrate 130, thereby preventing plasma from being diffused toward the upper area of the chamber. A shower head may be used as the curtain gas injecting means 190.

In addition, with the formation of the barrier 200 on the side surfaces of the electrodes 142 and 144, it is possible to shield plasma that may be generated by potential difference between the side surfaces of the electrodes 142 and 144 and the substrate 130. If an insulating material such as ceramic is used as the barrier 200, potential difference between the side surfaces of the electrodes 142 and 144 and the substrate 130 is greatly lowered. For example, in a case where potential difference between the side surfaces of the electrodes 142 and 144 and the substrate 130 is 10 V or more, if the insulative barrier 200 is formed on the side surfaces of the electrodes, potential difference between the electrodes and the substrate 130 is lowered to 1 V or less, thereby inhibiting generation of plasma. Further, when the barrier 200 is caused to extend from the side surfaces of the electrodes 142 and 144 toward the substrate 130, it is possible to physically prevent plasma generated in the plasma generating area (the edge region of the substrate) from being diffused into the central area of the substrate 130. Thus, it is effective to form the barrier 200 at the side surface of the first electrode 142 and to define a distance between the barrier 200 and the substrate 130 as about 0.1 to 5 mm. By defining the distance between the barrier 200 and the substrate 130 as about 0.1 to 5 mm, diffusion of plasma can be prevented physically. The thickness of the barrier 200 is preferably 0.3 to 10 mm.

According to the present invention described above, potential difference is applied between the substrate support with the substrate seated thereon and the electrodes surrounding the edge region of the substrate, and the distance between the substrate and the electrodes is set to 3 mm or less, so that plasma can be locally generated in an area between the substrate and the electrodes to remove particles and a thin film at the edge region of the substrate.

Further, a gas acting as a curtain is injected to the central area of the upper side of the substrate, thereby preventing plasma generated between the substrate and the electrodes from being introduced into the central area of the upper side of the substrate.

Moreover, the barrier is formed between the side surfaces of the electrodes and the substrate, thereby physically preventing introduction of plasma into the central area of the upper side of the substrate, and generation of plasma at the central area of the upper side of the substrate.

In addition, plasma can be generated at normal temperature and approximately atmospheric pressure.

What is claimed is:

1. A plasma etching apparatus, comprising:
   a chamber;
   a substrate support disposed in the chamber so that a substrate can be placed thereon;
   a first electrode located over an upper surface of the substrate and a second electrode located under a lower surface of the substrate, each electrode adjacent to an edge region of the substrate, the first electrode and the upper surface of the substrate defining a first gap therebetween and the second electrode and the lower surface of the substrate defining a second gap therebetween, the first gap and the second gap each being smaller than a third gap between an upper wall of the chamber and the substrate;
   a conductive frame which connects the first electrode with the second electrode, the conductive frame surrounding a side portion of the substrate, wherein a fourth gap is defined between the conductive frame and the substrate, the fourth gap corresponding to the first or second gap; and a power supply means for supplying power to the substrate support such that the power supplied to the substrate support can be provided to the substrate, wherein at least a portion of the first electrode, a portion of the second electrode, and a portion of the conductive frame overlap with the edge region of the substrate to enable generation of plasma in the first gap, the second gap and the fourth gap;

wherein at least one of the first and second electrodes is connected to a conductive frame and the conductive frame is moved up and down.

2. The plasma etching apparatus as claimed in claim 1, wherein the edge region of the substrate is in a range of 0.5 to 4 mm.

3. The plasma etching apparatus as claimed in claim 1, wherein the distance between the substrate and the upper wall of the chamber is 30 to 50 mm.

4. The plasma etching apparatus as claimed in claim 1, wherein the gap between the first electrode and the substrate is 0.1 to 5 mm.

5. The plasma etching apparatus as claimed in claim 1, wherein a dielectric film is formed on a surface of the first electrode corresponding to the substrate.

6. The plasma etching apparatus as claimed in claim 5, wherein a gap between the dielectric film and the substrate is 0.1 to 5 mm.

7. The plasma etching apparatus as claimed in claim 5, wherein the dielectric film is arranged and structured to surround the edge region of the substrate.

8. The plasma etching apparatus as claimed in claim 1, further comprising a non-reactive gas injection nozzle for injecting a non-reactive gas installed at a portion of the upper wall of the chamber corresponding to the substrate.

9. The plasma etching apparatus as claimed in claim 1, further comprising a reaction gas injection nozzle for injecting a reaction gas installed at the electrode.

10. The plasma etching apparatus as claimed in claim 1, further comprising a substrate support-driving unit installed below the substrate support so that the substrate support can be lifted and lowered to allow the substrate to be introduced into and withdrawn from the chamber.

11. The plasma etching apparatus as claimed in claim 1, wherein pressure in the chamber is maintained in a range of 700 to 800 Torr.

12. The plasma etching apparatus as claimed in claim 1, further comprising a magnetic field creating means installed below the electrode.

13. The plasma etching apparatus as claimed in claim 1, wherein the first electrode has a barrier formed on a side surface thereof and a portion of the barrier is extended toward the substrate.

14. The plasma etching apparatus as claimed in claim 13, wherein the barrier extends from the side surface of the first electrode toward the substrate, and a gap between the barrier and the substrate is 0.1 to 5 mm.

15. The plasma etching apparatus as claimed in claim 1, wherein electric potentials applied to the first and second electrodes are the same.

16. A plasma etching apparatus, comprising:
a chamber;
a substrate support disposed in the chamber so that a substrate can be placed thereon;
a first electrode located over an upper surface of the substrate and a second electrode located under a lower surface of the substrate, each electrode adjacent to an edge region of the substrate, the first electrode and the upper surface of the substrate defining a first gap therebetween and the second electrode and the lower surface of the substrate defining a second gap therebetween, the first gap and the second gap each being smaller than a third gap between an upper wall of the chamber and the substrate so as to generate plasma only at the edge region of the substrate thereby selectively etching only the edge region of the substrate;

a conductive frame which connects the first electrode with the second electrode, the conductive frame surrounding a side portion of the substrate, wherein a fourth gap is defined between the conductive frame and the substrate, the fourth gap corresponding to the first or second gap so as to generate plasma only at the edge region of the substrate thereby selectively etching only the edge region of the substrate; and a power supply means for supplying power to the substrates support such that the power supplied to the substrate support can be provided to the substrate, wherein at least a portion of the first electrode, a portion of the second electrode, and a portion of the conductive frame overlap with the edge region of the substrate;

wherein at least one of the first and second electrodes is connected to a conductive frame and the conductive frame is moved up and down.

17. The plasma etching apparatus as claimed in claim 16, wherein the first electrode has a barrier of an insulating material formed on a side surface thereof and a portion of the barrier is extended toward the substrate.

18. The plasma etching apparatus as claimed in claim 16, wherein the first electrode is arranged and structured to surround only the edge region of the substrate.

19. A plasma etching apparatus, comprising:
a chamber;
a substrate support disposed in the chamber so that a substrate can be placed thereon;
a first electrode located over an upper surface of the substrate and a second electrode located under a lower surface of the substrate, each electrode adjacent to an edge region of the substrate, the first electrode and the upper surface of the substrate defining a first gap therebetween and the second electrode and the lower surface of the substrate defining a second gap therebetween, wherein a sum of the first gap and the second gap is smaller than a third gap between an upper wall of the chamber and the substrate;

a conductive frame which connects the first electrode with the second electrode, the conductive frame surrounding a side portion of the substrate, wherein a fourth gap is defined between the conductive frame and the substrate, the fourth gap corresponding to the first or second gap, and a power supply means for supplying power to the substrate support and to the substrate, wherein at least a portion of the first electrode, a portion of the second electrode, and a portion of the conductive frame overlap with the edge region of the substrate to enable generation of plasma in the first gap, the second gap and the fourth gap;

wherein at least one of the first and second electrodes is connected to a conductive frame and the conductive frame is moved up and down.

* * * * *